United States Patent [19]
Klotz

[11] Patent Number: 4,816,772
[45] Date of Patent: Mar. 28, 1989

[54] WIDE RANGE LINEAR AUTOMATIC GAIN CONTROL AMPLIFIER

[75] Inventor: Dale B. Klotz, Marion, Iowa

[73] Assignee: Rockwell International Corporation, El Segundo, Calif.

[21] Appl. No.: 166,357

[22] Filed: Mar. 9, 1988

[51] Int. Cl.$^4$ .............................................. H03G 3/30
[52] U.S. Cl. .................................. 330/254; 330/279; 330/285; 330/311
[58] Field of Search ............. 330/254, 279, 285, 311; 307/490, 492, 493; 328/142, 145

[56] References Cited

U.S. PATENT DOCUMENTS

| | | | |
|---|---|---|---|
| 3,469,195 | 9/1969 | Harwood | 325/405 |
| 3,665,507 | 5/1972 | Peil | 325/315 |
| 3,886,380 | 5/1975 | Sobajima et al. | 330/254 X |
| 4,054,849 | 10/1977 | Yamada | 333/14 |
| 4,223,274 | 9/1980 | Paulke et al. | 330/133 |
| 4,380,711 | 4/1983 | Cunningham | 307/491 |
| 4,426,625 | 1/1984 | Harwood et al. | 330/254 |
| 4,514,702 | 4/1985 | Zogg | 330/254 |
| 4,607,234 | 8/1986 | Nordholt et al. | 330/254 X |

FOREIGN PATENT DOCUMENTS

59-97213  6/1984  Japan .

OTHER PUBLICATIONS

Olson, "Log Function Generator", *IBM Technical Disclosure Bulletin*, vol. 7, No. 7, Jul. 1964, pp. 133, 134.

*Primary Examiner*—James B. Mullins
*Attorney, Agent, or Firm*—John C. McFarren; M. Lee Murrah; H. Fred Hamann

[57] ABSTRACT

An automatic gain control (AGC) amplifier, which may be fabricated as a monolithic integrated circuit, provides linear gain response in dB over a wide dynamic range. The AGC amplifier comprises multiple cascode amplifier stages connected in cascade to provide high power handling capability and high gain. A control voltage is input to a linearization circuit which provides an output to an operational amplifier that functions as a voltage controlled voltage source (VCVS). The VCVS produces a conditioned control voltage which is fed back to the linearization circuit and provided to each of the cascode amplifier stages. The conditioned control voltage provided to each amplifier stage causes current to be removed from the cascode amplifier, thereby lowering its gain. The overall gain of the AGC amplifier is linear in dB with respect to linear changes in the control voltage applied to the linearization circuit.

9 Claims, 2 Drawing Sheets

WIDE RANGE LINEAR AUTOMATIC GAIN CONTROL AMPLIFIER

TECHNICAL FIELD

The present invention relates to electronic amplifiers and, in particular, to an automatic gain control amplifier in which a linear change in the control voltage causes a linear gain response in dB over a wide dynamic range.

BACKGROUND OF THE INVENTION

Automatic gain control (AGC) amplifiers generally have a non-linear gain response with respect to changes in the control voltage. In some applications, such as receivers associated with null steering antennas in satellite communications systems for example, it is desirable to have an AGC amplifier that provides linear gain in dB over a wide dynamic range.

One advantage of a linear AGC amplifier in a satellite tracking antenna system is that a portion of the electronic circuitry for a steering antenna can be effectively integrated into the amplifier itself, thus eliminating extra circuitry and/or software. More importantly, by knowing the linear slope of the amplifier's power curve, jamming can be more easily detected, quantified and corrected for. This aspect of a linear amplifier can be advantageous where a tracking antenna is located near a communications antenna operating at a close frequency. In this environment, the tracking antenna must be able to maintain satellite tracking in the presence of "friendly jamming" from high power communications transmissions.

Presently available AGC amplifiers do not combine a high signal level capability with a high gain response that is linear in dB as a result of linear changes in the control voltage. In addition, power dissipation is a major concern when high gain amplifiers are fabricated as monolithic integrated circuits. Thus, there is a need for an AGC amplifier implemented as a monolithic integrated circuit that also has high power handling capability, stable gain adjustable over a wide range, and linear gain response in dB with respect to changes in the control voltage.

SUMMARY OF THE INVENTION

The present invention is an automatic gain control (AGC) amplifier designed to be fabricated as a monolithic integrated circuit and to provide linear gain response in dB over a wide dynamic range. The AGC amplifier comprises multiple cascode amplifier stages connected in cascade to provide high power handling capability and high gain.

Cascode amplifier stages are utilized because they may be controlled by additional circuitry to produce a logarithmic change in gain, which is linear in dB with respect to a control voltage. In the present invention, the control
r voltage is applied to a linearization circuit utilizing large bipolar transistors. The output of the linearization circuit is input to an operational amplifier that functions as a voltage controlled voltage source (VCVS). The VCVS produces a conditioned control voltage that is a non-linear, scaled-down function of the control voltage input to the linearization circuit. The conditioned control voltage is fed back to the linearization circuit and is provided to each of the multiple cascode amplifier stages.

Each cascode amplifier stage provides maximum gain when the conditioned control voltage is at a minimum. As the conditioned control voltage increases, current is removed from the cascode amplifier, thereby lowering its gain. The linearization circuit and the VCVS condition the control voltage so that a linear change in the control voltage applied to the linearization circuit results in a linear change in dB of the overall gain of the AGC amplifier.

BRIEF DESCRIPTION OF THE DRAWINGS

For a more complete understanding of the present invention and for further advantages thereof, reference is made to the following Description of the Preferred Embodiment taken in conjunction with the accompanying Drawings, in which.

DESCRIPTION OF THE PREFERRED EMBODIMENT

Figure 1:
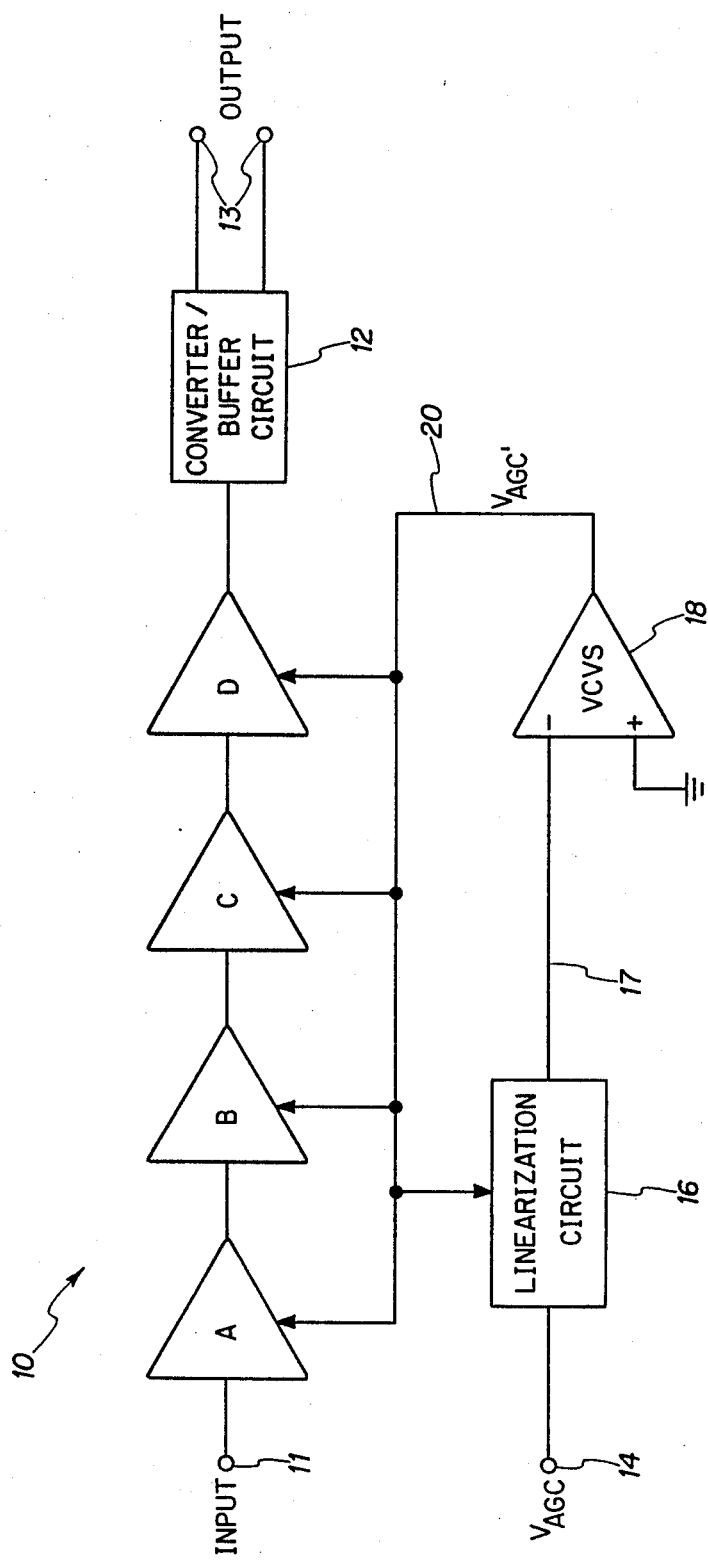
FIG. 1 is a block diagram of the linear AGC amplifier of the present invention.

Referring to FIG. 1, the automatic gain control (AGC) amplifier of the present invention is generally identified by reference numeral 10. An input signal is provided at terminal 11 of AGC amplifier 10. Amplifier 10, which may be fabricated as a monolithic integrated circuit, comprises amplifier stages A, B, C, and D connected in cascade. Stage D is connected to a single-to-differential converter and buffer circuit 12 that provides an output signal at terminals 13.

The gain of AGC amplifier 10 is controlled by a control voltage $V_{agc}$ provided at terminal 14. Control voltage $V_{agc}$ is applied to a linearization circuit 16 which provides an output on line 17 connected to an operational amplifier functioning as a voltage controlled voltage source (VCVS) 18. VCVS 18 provides a conditioned control voltage $V_{agc}'$ on line 20 that is fed back to the linearization circuit 16 and applied to each of the amplifier stages A, B, C, and D. AGC amplifier 10 is designed so that its overall gain in dB is linear in response to linear changes in control voltage $V_{agc}$ at terminal 14. Amplifier 10 has an AGC range of approximately 95 dB at a maximum input power of $-4.0$ dBm at 50 ohms and an output power of $-4.0$ dBm at 300 ohms.

Figure 2:
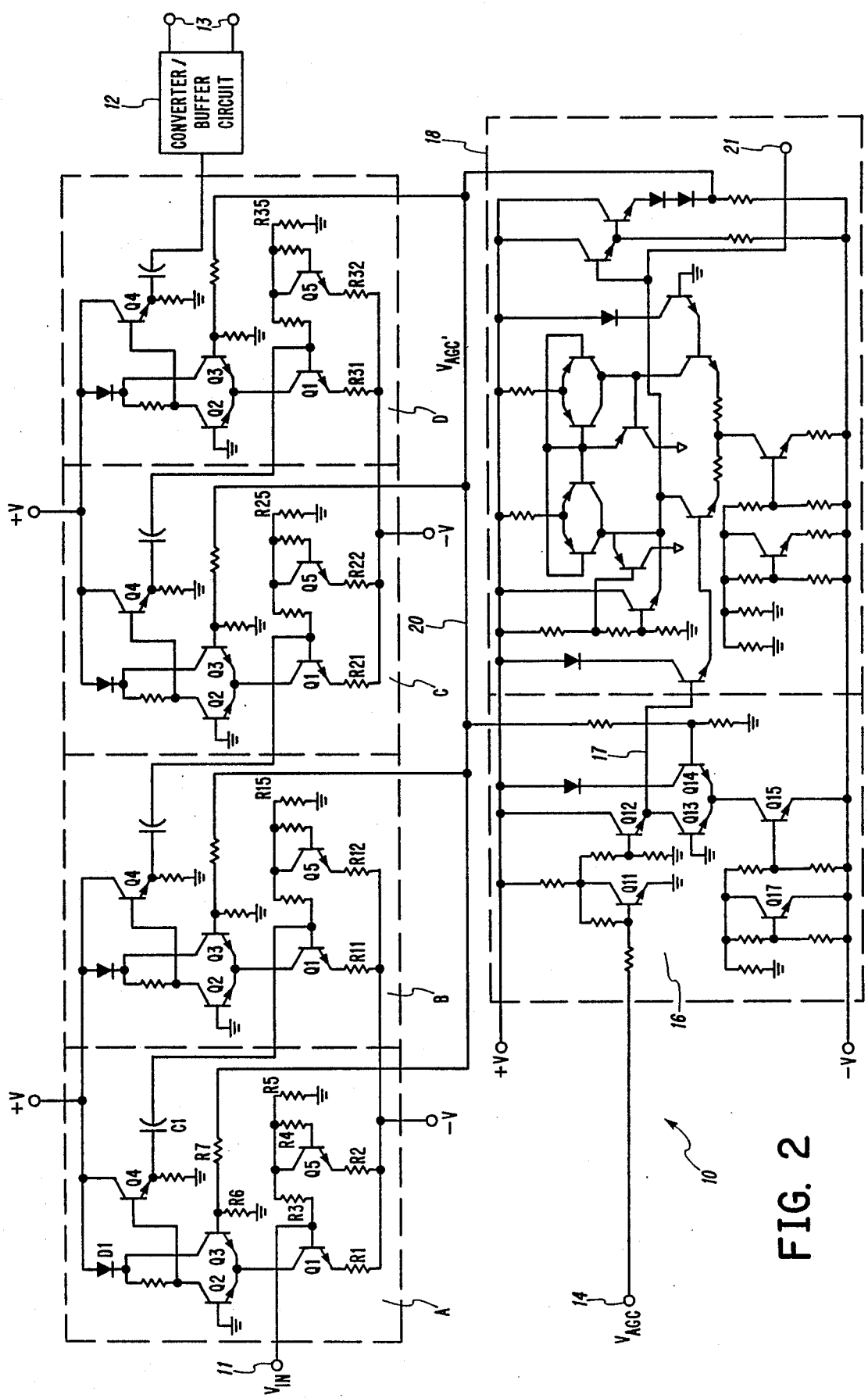
FIG. 2 is a schematic circuit diagram of the present invention.

Referring to FIG. 2, AGC amplifier 10 is illustrated in a schematic circuit diagram. The input signal at terminal 11 is amplified by amplifier stages A, B, C, and D which are connected in a cascade configuration. Voltage supply transients are reduced by separating the supply buses for amplifier stages A and B from the buses for stages C and D as shown in FIG. 2. Because amplifier stages A, B, C, and D are nearly identical, the following description of the operation of amplifier stage A applies similarly to amplifier stages B, C, and D.

Amplifier stage A is designed around a basic cascode amplifier comprising transistors Q1 and Q2. Cascode amplifier stages are used in the design of linear AGC amplifier 10 because of their high power handling capability, high but stable gain, and gain response capability over a wide dynamic range.

The input signal at terminal 11 is applied to the base of transistor Q1, which functions as part of a current source for amplifier stage A. The current source also includes a complementary transistor Q5, a complementary resistor R2 which equals resistor R1, complementary resistors R3 and R4 which are equal, and resistor R5 which sets the maximum current corresponding to zero automatic gain. The complementary components function to reduce current variations due to temperature changes, part tolerances, and manufacturing processes so that an absolute current can be established through the cascode amplifier. The corresponding resistors R11, R12, and R15 of stage B; R21, R22, and R25 of Stage C; and R31, R32, and R35 of Stage D perform similar functions for their respective amplifier stages but have values that are scaled to provide the desired overall gain of AGC amplifier 10.

Automatic gain control of the cascode amplifier stage A is implemented by transistor Q3 connected in parallel with transistor Q2. A conditioned control voltage $V_{agc}'$, which is described below, is applied to the base of transistor Q3 through divider resistors R6 and R7, which help reduce interaction between the amplifier stages. The emitter of transistor Q4 provides the output of amplifier stage A to amplifier stage B, with inter-stage coupling capacitor C1 provided to limit potential feedback between stages. The maximum gain of amplifier stage A is achieved when the conditioned control voltage at the base of transistor Q3 is at a minimum. As the conditioned control voltage increases, transistor Q3 draws current away from transistor Q2, thus lowering the gain of amplifier stage A. Diode D1 prevents transistor Q4 from having zero base-collector voltage at minimum gain conditions and prevents collector-emitter breakdown of transistor Q3. Amplifier stages B, C, and D function similarly to stage A to control the overall gain of AGC amplifier 10. The output from stage D is applied to a single-to-differential converter and buffer circuit 12 which provides an output signal on terminals 13.

Linearization of AGC amplifier 10 is implemented by providing the control voltage $V_{agc}$ at terminal 14 to the linearization circuit 16. The linearizer portion of linearization circuit 16 includes transistors Q11 and Q12, which are large bipolar NPN transistors. The large emitter areas of transistors Q11 and Q12 help to reduce non-linearities at high current densities because of their lower resistance.

Control voltage $V_{agc}$, which ranges from zero to 4 volts, is applied to the base of transistor Q11. The voltage $V_{agc}$ is inverted at the collector of transistor Q11 and also at the base of transistor Q12. Thus, a rise in $V_{agc}$ results in a linear fall in the base-emitter voltage of transistor Q12. This linear change in the base-emitter voltage produces an exponential change in the collector current of transistor Q12. The purpose of the linearization circuit 16 is to keep this linear base-emitter voltage as linear as possible over a range of several decades to produce the desired collector current. This circuit forms the basis for the gain control of the entire AGC amplifier 10.

To produce the conditioned AGC voltage $V_{agc}'$, the linearization circuit 16 includes a pseudo-cascode circuit that imitates the cascode amplifiers, such as described above in amplifier stage A. In FIG. 2, the lower portion of linearization circuit 16, which includes transistors Q13–17, is a pseudo-cascode stage. Transistors Q15 and Q17 function as a current source similar to transistors Q1 and Q5 of amplifier stage A. In addition, the current source circuit including transistors Q15 and Q17 is identical to the linearizer comprising transistors Q11 and Q12 so that both circuits will track together. The current source circuit must always be able to provide more current than the linearizer demands. If this were not true, there would be a flat spot in the AGC response curve. Also, the pseudo-cascode circuit is provided with the conditioned control voltage $V_{agc}'$ as a feedback signal applied to the base of transistor Q14 so that the current source of the linearization circuit 16 imitates the cascode amplifier stages by maintaining a fixed current.

The small voltage changes at the emitter of transistor Q12, which correspond to changes in the input control voltage $V_{agc}$, are provided on line 17 as an intermediate non-linear voltage input to the operational amplifier functioning as voltage controlled voltage source (VCVS) 18. VCVS 18 produces conditioned control voltage $V_{agc}'$, which is a non-linear function of the input control voltage $V_{agc}$. Conditioned control voltage $V_{agc}'$ is output on line 20, fed back to linearization circuit 16, and provided to each of the cascode amplifier stages A, B, C, and D. Terminal 21 of VCVS 18 is connected to an external capacitor that sets a dominant pole to provide stability for VCVS 18.

As a brief summary of the operation of AGC amplifier 10, an increase in control voltage $V_{agc}$ at terminal 14 causes the voltage at the base of transistor Q12 to decrease. A small decrease in the voltage at the emitter of transistor Q12, which is functionally related to the increase in the control voltage $V_{agc}$, is provided to VCVS 18 on line 17. The voltage on line 17 is amplified, inverted, and level shifted by VCVS 18 and output on line 20 as conditioned voltage $V_{agc}'$. Conditioned voltage $V_{agc}'$ is fed back to linearization circuit 16 and provided to the base of transistor Q3 in each of the amplifier stages. As conditioned voltage $V_{agc}'$ increases at the base of transistor Q3, the collector current in transistor Q3 increases exponentially, and the collector current in transistor Q2 falls accordingly because the total current to both transistors Q2 and Q3 is fixed. Because a linear change in the control voltage $V_{agc}$ causes an exponential change in the collector current in transistor Q3, the control voltage change yields a linear gain change in dB. Therefore, AGC amplifier 10 provides a linear gain in dB in response to a linear change in the control voltage. The output of amplifier stage D is applied to a single-to-differential converter and buffer circuit 12 to limit the output power to −4.0 dBm at 300 ohms.

The preferred embodiment of AGC amplifier 10 illustrated in FIG. 2 produces a maximum gain of approximately 65 dB at a control voltage $V_{agc}$ of zero. Amplifier 10 has an AGC linear dynamic range of approximately 95 dB with a gain reduction per volt of approximately 30 dB/volt.

The AGC amplifier of the present invention may also be configured as a differential amplifier. In this alternative embodiment, an additional cascode amplifier, comprising transistors Q1, Q2, and Q3, is connected in each stage of amplifier 10 to form a differential amplifier as is well known in the art.

Although the present invention has been described with respect to a specific embodiment thereof, various changes and modifications may be suggested to one skilled in the art, and it is intended that the present invention encompass such changes and modifications as fall within the scope of the appended claims.

I claim:
1. A linear automatic gain control (AGC) amplifier comprising:
   a cascode amplifier for providing high gain amplification of an input signal;

a linearization circuit for receiving a control voltage and producing an intermediate voltage functionally related to said control voltage; and a voltage controlled voltage source connected for receiving said intermediate voltage and for providing a conditioned control voltage to said cascode amplifier such that the gain of said amplified input signal is linear in dB in response to linear changes in said control voltage.

2. The AGC amplifier of claim 1, wherein said voltage controlled voltage source (VCVS) comprises an operational amplifier that outputs said conditioned control voltage to said cascode amplifier and to said linearization circuit as a feedback signal.

3. The AGC amplifier of claim 1, wherein said linearization circuit comprises..

a first NPN transistor having a base connected to receive said control voltage, a collector connected to a voltage supply, and an emitter connected to ground; and a second NPN transistor having a base connected to the collector of said first transistor, a collector connected to said voltage supply, and an emitter connected to a current supply circuit, the emitter of said second transistor providing said intermediate voltage.

4. The AGC amplifier of claim 1, further comprising a plurality of cascode amplifiers connected in cascade, wherein each of said plurality of cascode amplifiers receives said conditioned control voltage.

5. A linearization circuit for an automatic gain control (AGC) amplifier, comprising:

a first NPN transistor having a base connected to receive a control voltage, a collector connected to a voltage supply, and an emitter connected to ground;

a second NPN transistor having a base connected to the collector of said first transistor, a collector connected to said voltage supply, and an emitter connected to a current supply circuit, the emitter of said second transistor providing an intermediate voltage output; and a voltage controlled voltage source (VCVS) connected for receiving said intermediate voltage output and providing a conditioned control voltage to the AGC amplifier and to the linearization circuit as a feedback signal.

6. The linearization circuit of claim 5, wherein the gain of the AGC amplifier is linear in dB in response to linear changes in said control voltage applied to the base of said first NPN transistor.

7. The linearization circuit of claim 6, wherein the AGC amplifier comprises a plurality of cascode amplifier stages connected in cascade, and wherein each of said plurality of cascode amplifier stages receives said conditioned control voltage from said VCVS.

8. A linear automatic gain control (AGC) amplifier, comprising:

a plurality of cascode amplifiers connected in cascade for providing high gain amplification of an input signal;

a linearization circuit for receiving a control voltage and providing an intermediate voltage output; and a voltage controlled voltage source (VCVS) for receiving said intermediate voltage output and providing a conditioned control voltage to each of said plurality of cascode amplifiers and to said linearization circuit as a feedback signal, wherein linear changes in said control voltage produce linear gain in dB of said amplified signal.

9. The AGC amplifier of claim 10, wherein said linearization circuit comprises:

a first NPN transistor having a base connected to receive said control voltage, a collector connected to a voltage supply, and an emitter connected to ground; and a second NPN transistor having a base connected to the collector of said first transistor, a collector connected to said voltage supply, and an emitter connected to a current supply circuit, the emitter of said second transistor providing said intermediate voltage output.

* * * * *